(12) United States Patent
Okubo

(10) Patent No.: US 6,369,638 B2
(45) Date of Patent: Apr. 9, 2002

(54) POWER DRIVE CIRCUIT

(75) Inventor: Toshiro Okubo, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/730,097

(22) Filed: Dec. 5, 2000

(30) Foreign Application Priority Data

Dec. 7, 1999 (JP) .......................................... 11-347113

(51) Int. Cl.[7] .............................................. H03K 17/56
(52) U.S. Cl. ...................... 327/423; 327/424; 327/588; 327/112
(58) Field of Search .............................. 326/80, 83, 85, 326/87, 91; 327/108, 112, 374, 333, 423, 494, 588, 424

(56) References Cited

U.S. PATENT DOCUMENTS

| 4,818,901 A | * | 4/1989 | Young et al. .................. 326/27 |
| 5,424,683 A | * | 6/1995 | Takahashi .................... 330/255 |
| 5,455,496 A | * | 10/1995 | Williams et al. ............. 318/563 |
| 5,479,134 A | * | 12/1995 | Nishioka et al. ............. 330/273 |
| 5,483,197 A | * | 1/1996 | Nishioka et al. ............. 330/273 |
| 5,528,172 A | * | 6/1996 | Sundstrom .................... 326/80 |
| 5,585,740 A | * | 12/1996 | Tipon .......................... 326/26 |
| 5,966,041 A | * | 10/1999 | Maone ......................... 327/417 |
| 6,166,580 A | * | 12/2000 | Sessions ...................... 327/333 |
| 6,262,599 B1 | * | 7/2001 | Coughlin, Jr. et al. ......... 326/81 |

* cited by examiner

Primary Examiner—Tuan T. Lam
Assistant Examiner—Hiep Nguyen
(74) Attorney, Agent, or Firm—Hogan & Hartson, L.L.P.

(57) ABSTRACT

A balanced transformer-less (BTL) power drive circuit comprises a push-pull type output transistor section connected with a main power supply PowVcc, and an input control section connected with an auxiliary power supply for providing the output transistor section with a control signal. The potential of the auxiliary power supply is selectively set equal to or above the supply potential of the main power supply, depending on the requirements for the dynamic range of the power drive circuit. In accord with the potential of the auxiliary power supply thus set, the output reference potential Vref is set to the medium of the dynamic range, thereby ensuring the linearity of the input-output characteristic of the drive circuit, irrespective of the selected level of the auxiliary power supply.

4 Claims, 10 Drawing Sheets

POWER DRIVE CIRCUIT

FIELD OF THE INVENTION

The invention relates to a balanced transformer-less (BTL) power drive circuit for use in a disk drive system for a CD, a CD-ROM, and an MD for example.

BACKGROUND OF THE INVENTION

Many of disk drive systems for CDs, CD-ROMs, and MDs employ a BTL power drive circuit. FIG. 1 shows a push-pull type power drive circuit for use in a BTL power drive circuit having two such push-pull drive circuits.

As shown in FIG. 1, an NPN output transistor Q1 and an NPN output transistor Q2 are connected in series between a main power supply having an electric potential PowVcc and the ground of potential E. The node of the transistors Q1 and Q2 is connected to the output terminal of the circuit for provision of an output potential Vout. Connected between the base and the emitter of the transistor Q1 is a resistor R1, and connected between the collector and the base of the transistor Q2 are a PNP transistor Q4 and a capacitor C1, and is a resistor R2 between the base and the emitter of the transistor Q2. The output terminal OUT is also connected, via a resistor R5, to a node having a reference output potential Vref (which will be hereinafter referred to as internal reference potential Vref).

When an input signal Vin is supplied to the input terminal IN of a pre-buffer section (hereinafter referred to as pre-buffer circuit) B1 serving as an input control section of the power drive circuit. An PNP transistor Q3 of the pre-buffer circuit B1 provides its output signal to the bases of the transistors Q1 and Q2, under the control of the input signal Vin.

The pre-buffer circuit B1 further includes PNP transistors Q5 and Q6, and NPN transistors Q7 and Q8, resistors R3, R4, and R6, a diode D1, and constant current sources I1, I2, and I3, as shown in FIG. 1.

The input signal Vin shown in FIG. 1 is formed by an input signal and an internal reference potential Vref in a pre-stage difference amplifier circuit (not shown) which is driven by the potential PowVcc of the main power supply PowVcc. In other words, a DC potential arising from the main power supply potential PowVcc is superposed on the input signal Vin at the input terminal IN.

When no signal is supplied to the power drive circuit shown in FIG. 1, i.e. the level of the input signal Vin is zero, the level of the output potential Vout of the circuit is equal to the internal reference potential Vref. Since the NPN output transistors Q1 and Q2 are controlled by the input signal Vin, the output potential Vout is swung accordingly in the positive/negative direction about the internal reference potential Vref as the input signal Vin deviates from zero in the positive/negative direction.

The upper limit of the output potential Vout of the power drive circuit is defined by the saturation voltage Vsat of the PNP output transistor Q3 and by the forward base-emitter potential drop Vf of the NPN output transistor Q1, so that the upper limit will be [PowVcc−Vsat−Vf]. Similarly, the lower limit of the output potential Vout is defined to be the saturation voltage Vsat of the NPN output transistor Q2.

Consequently, the width of the dynamic range of the output potential Vout will be [PowVcc−2Vsat−Vf], with the internal reference potential Vref set to the medium [(PowVcc−Vf)/2].

FIG. 2 shows a BTL power drive circuit comprising of two push-pull type power drive circuits as shown in FIG. 1, where components in one power drive circuit that correspond to the counterparts in the other power drive circuit are denoted with primes ('). It is noted that a load L is connected between the output terminal OUT of one power drive circuit and the output terminal OUT' of the other power drive circuit, and that an inverted input signal $\overline{\text{Vin}}$, which is the inversion of the input signal Vin, is applied to the input terminal $\overline{\text{IN}}$ of the other power drive circuit.

In the BTL power drive circuit of FIG. 2, the output potentials Vout and Vout' of the output terminals OUT and OUT', respectively, are swung in the opposite directions with respect to the internal reference potential Vref in response to the input signal Vin, so that the dynamic range of the output potential Vout is double that of the power drive circuit of FIG. 1, thereby providing a doubly large driving power for the load.

However, in the power drive circuit of FIG. 1 and hence in the BTL power drive circuit of FIG. 2, the upper limits of the output potential Vout and Vout' are limited by the saturation voltage Vsat of the PNP transistor Q3 and the forward potential drop across the base-emitter of the NPN transistor Q1. The forward base-emitter potential drop Vf is substantially constant and has a dominant influence on the output voltage Vout and Vout' as compared with the saturation voltage Vsat. Thus, in order to extend the dynamic range of a power drive circuit driven by a main power supply having a low potential PowVcc, it is desirable to remove the influence of the forward base-emitter potential drop Vf.

FIG. 3 shows a push-pull type power drive circuit which is an improvement of the power drive circuit of FIG. 1, in which dynamic range is extended by increasing the upper limit of the output potential Vout.

In FIG. 3, the main power supply of potential PowVcc is used as the power supply for the NPN output transistor Q1 and the NPN output transistor Q2. In addition, a further auxiliary power supply of potential PreVcc is used as the power supply for the pre-buffer circuit B1 that includes the PNP transistor Q3 and other elements.

In a disk system such as a CD-ROM which includes a high-voltage power supply of 12 Volt in addition to an ordinary 5 Volt power supply, the high-voltage power supply may be used as the auxiliary power supply PreVcc.

In this instance, the pre-stage differential amplifier circuit which receives a pre-stage input signal and an internal reference potential Vref, is driven by the auxiliary power supply potential PreVcc. The input signal Vin is fed to the input terminal IN and is superposed on a DC potential arising from the auxiliary power supply PreVcc.

As described above, when the potential PreVcc of the auxiliary power supply is the same as that of the main power supply PowVcc, as shown in FIG. 1, the upper limit of the output potential Vout, is given by [PowVcc−Vsat−Vf], since the upper limit is given by the larger one of the saturation voltage Vsat of the NPN output transistor Q1 and the sum of the saturation voltage Vsat of the PNP transistor Q3 and the forward base-emitter potential drop Vf of the NPN output transistor Q1.

In contrast, the upper limit of the output potential Vout of the circuit of FIG. 3 is given by the supply potential PowVcc of the main power supply minus the saturation voltage Vsat of the NPN output transistor Q1, [PowVcc−Vsat], since the upper limit is given by the smaller one of the auxiliary power supply potential PreVcc minus the saturation voltage Vsat of the PNP transistor Q3 and the forward base-emitter potential drop Vf of the NPN output transistor Q1, and the potential of the main power supply PowVcc minus the saturation voltage Vsat of the NPN output transistor Q1. Thus, the dynamic range of the drive circuit of FIG. 3 is extended by the enlarged output potential Vout.

It should be noted that although the dynamic range is extended on one hand by the use of the auxiliary power supply having as high as 12 Volts in the circuit shown in FIG. 3, high energy consumption by the pre-buffer circuit B1 is inevitable so long as the pre-buffer B1 uses the auxiliary power supply.

It would be understood that a BTL power drive circuit having an extended dynamic range can be formed, as shown in FIG. 4, using two power drive circuits shown in FIG. 3 having an extended upper limit of the output potential Vout. The BTL power drive circuit as shown in FIG. 4 has basically the same operational characteristics as the BTL power drive circuit as shown in FIG. 2, and a further description thereof will be omitted.

FIG. 5 shows the characteristic behaviors of the power drive circuits shown in FIGS. 1 and 3 in terms of the input signal Vin as a function of the output potential Vout. In the FIG. 5, "i" stands for the characteristic for the circuit shown in FIG. 1, and "ii" stands for the characteristic of the circuit shown in FIG. 3.

By comparing the characteristic curves "i" and "ii" shown in FIG. 5, it is seen that the upper limit Vout of the power drive circuit shown in FIG. 3 is higher than the upper limit of the corresponding output potential of the power drive circuit shown in FIG. 1 by the forward base-emitter potential drop Vf.

FIG. 6 shows characteristic curves "i" and "ii" representing the output potentials Voo of the BTL power drive circuits shown in FIGS. 2 and 4, respectively, in term of the input signal Vin.

It would be understood from FIG. 6 that the dynamic range of the output potential Voo is, for the BTL power drive circuit shown in FIG. 4, is extended to ±[PowVcc−2Vsat] as shown by the characteristic curve "ii", as opposed to ±[PowVcc−2Vsat−Vf] as shown by the curve "i" for the BTL power circuit shown in FIG. 2.

It should be noted, however, that, in the regions denoted by ΔVin, i.e. in the regions Vin>Vi and Vin<−Vi, where Vi is the input potential at which the output potential Vout saturates, the input-output gain of the power circuit of FIG. 4 decreases by a factor of ½ as compared with the gain in the region −Vi<Vin<Vi, as seen from the curve "ii". This is due to the fact that, in the case of "ii", unlike the case of "i", the saturation voltage as approached from the internal reference potential Vref to the potential of the main power supply PowVcc is greater than that approached to the ground potential E.

Consequently, although the dynamic range can be extended in the power drive circuits as shown in FIGS. 3 and 4, the linearity in the input-output characteristic is disadvantageously lost.

SUMMARY OF THE INVENTION

It is therefore an object of the invention to provide a BTL power drive circuit having two sets of drive circuits each having a push-pull type output transistor section driven by a common main power supply and an input control section driven by a common auxiliary power supply, characterized in that said BTL power drive circuit is capable of providing an extended dynamic range without losing the linearity of the input-output characteristic of the drive circuit by setting the potential of said auxiliary power supply equal to or above the supply potential of said main power supply.

In accordance with one aspect of the invention, a power drive circuit includes: a first push-pull type output transistor section connected between a main power supply having a potential PowVcc and the ground of potential E; a first input control section, connected between an auxiliary power supply of potential PreVcc and said ground of potential E, for receiving an input signal Vin and an output reference potential Vref to provide said first push-pull type output transistor section with a first control signal; a second push-pull type output transistor section connected between said main power supply of potential PowVcc and the ground of potential E; a second input control section connected between said auxiliary power supply of potential PreVcc and the ground of potential E, for receiving said output reference voltage Vref and an inverted input signal $\overline{Vin}$, which is an inversion of said input signal Vin, to provide said second push-pull type output transistor section with a second control signal; wherein each of said first and said second output transistor sections are adapted to provide two different dynamic ranges, one for a first mode where the potential PreVcc of said auxiliary power supply is equal to the potential PowVcc of said potential of the main power supply and another for a second mode where the potential PreVcc of said potential of the main power supply is higher than the potential PowVcc of said potential of the main power supply, said balanced transformer-less power drive circuit characterized in that said output reference potential Vref is set to a level in accord with the level of said potential PreVcc of said auxiliary power supply which is set equal to or above the potential PowVcc such that said level of said output reference potential Vref matches the medium of the dynamic ranges of said first and second output transistor sections.

In this BTL power drive circuit, in defining the dynamic range of the BTL power drive circuit, the potential of the auxiliary power supply is selectively set equal to or above the potential of the main power supply for a compromise between a dynamic range requirement and allowable power consumption of the circuit. The linearity of the input-output characteristic of the power drive circuit is always secured by setting the output reference potential (i.e. the internal reference potential) to the medium of the dynamic range as defined by the selected potential of the auxiliary power supply.

The BTL circuit may further comprise a reference potential set-up circuit capable of selectively setting up two different potentials for use as the medium of the dynamic range of the output transistor sections.

The reference potential set-up circuit may includes a circuitry having a transistor Q11 connected in parallel with a diode D11 to generate two different output reference potentials across the diode D11 by turning on and off the transistor Q11.

The reference potential set-up circuit may comprise: a circuitry including a transistor Q11 and a diode D11 connected in parallel with said transistor Q11; series connected voltage dividing resistors R11 and R12; and control means for controlling the conduction of said transistor Q11, with all of said circuitry Q11 and D11, series connected voltage diving resistors R11 and R12, and control means connected between said main power supply of potential PowVcc and the ground of potential E, wherein said output reference potential is given by the potential obtained at the node of said voltage dividing resistors R11 and R12.

This arrangement has a feature that an appropriate output reference potential Vref can be securely set up in a simple manner through the selection of the potential PreVcc of the auxiliary power supply.

DETAILED DESCRIPTION OF THE PREFERRED EMBODIMENT

Figure 7:
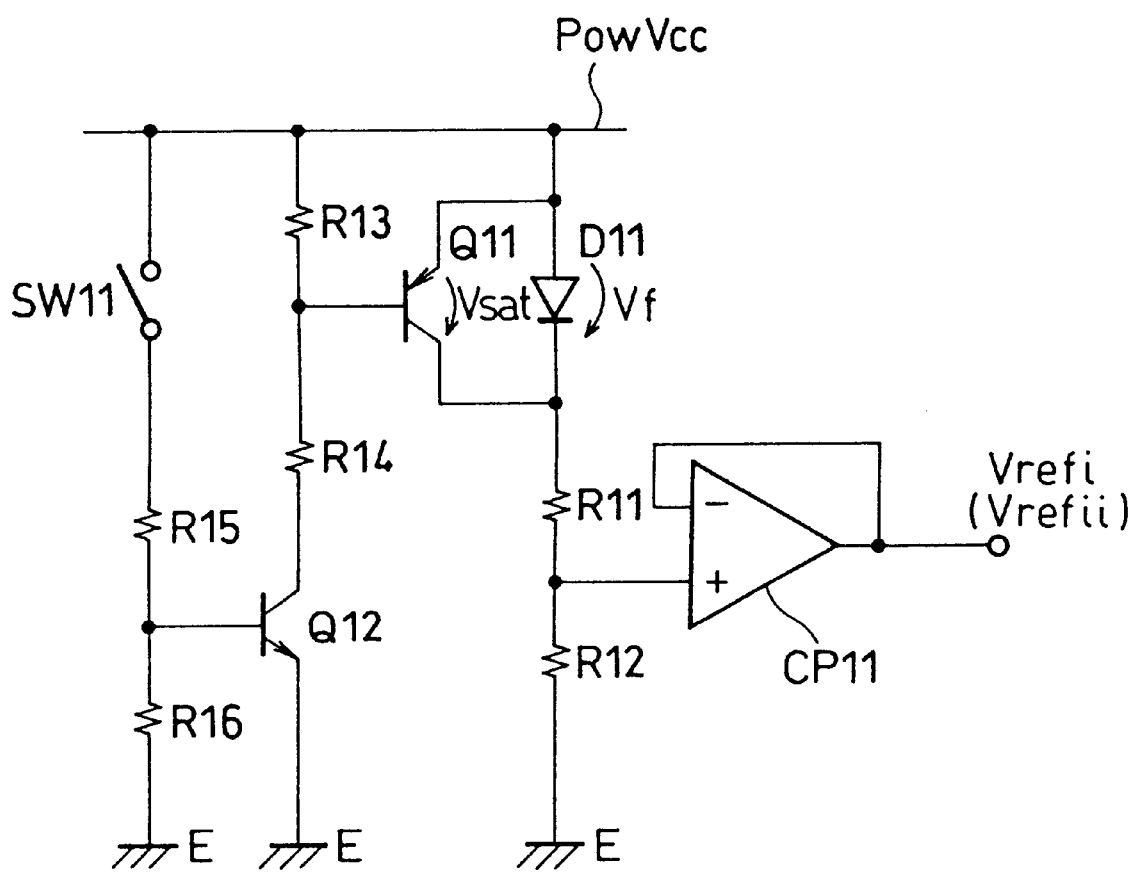
FIG. 7 is a diagram representation of an internal reference potential set-up circuit embodying the invention.

Referring to FIG. 7, there is shown a circuit for setting up an internal reference potential Vref (hereinafter referred to as internal reference potential set-up circuit) embodying the invention. It is seen in the Figure that a diode D11 and a PNP transistor Q11 connected in parallel with the diode D11 and a series connected resistors R11 and R12 are connected between a main power supply of potential PowVcc and the ground of potential E. The node of the resistors R11 and R12 is connected with a non-inverted input terminal "+" of an operational amplifier CP11 which is connected in the form of a voltage follower. The output of the operational amplifier CP11 is used as the internal reference potential Vref.

Connected in series between the main power supply of potential PowVcc and the ground of potential E are a switch SW11, series connected resistors R15 and R16. Resistors R13 and R14 and an NPN transistor Q12 are also connected between the main power supply and the ground. The node of the resistors R15 and R16 is connected with the base of the NPN transistor Q12, and the node of the resistors R13 and R14 is connected with the base of the PNP transistor Q11.

As seen in FIG. 7, while the switch SW11 is open, the NPN transistor Q12 and the PNP transistor Q11 are turned off, so that potential drop across the parallel circuit of the diode D11 and the PNP transistor Q11 is given by the forward potential drop Vf of the diode D11. As a result, assuming that the resistors R11 and R12 have the same resistance, the internal reference potential Vref in this instance is $$Vrefi=(PowVcc-Vf)/2.$$

On the other hand, when the switch SW11 is closed, the NPN transistor Q12 and the PNP transistor Q11 are turned on, so that the potential drop across the diode D11 and the PNP transistor Q11 is given by the saturation voltage Vsat of the PNP transistor Q11. The internal reference potential Vref is then $$Vrefii=(PowVcc-Vsat)/2.$$

In this case, one may regard the internal reference potential Vrefii as PowVcc/2 since the forward base-emitter potential drop Vf of the PNP transistor Q11 is substantially constant in the range of Vf from 0.6 to 0.7 Volts while the saturation voltage Vsat of the transistor Q11 is much smaller than the Vf, that is, Vsat<<Vf.

The switch SW11 shown in FIG. 7 may be replaced by any convenient fuse. The diode D11 and the parallel PNP transistor Q11 may be placed at any convenient position in the circuit so long as they can be turned on and off as needed to change the internal reference potential Vref.

Figure 1:
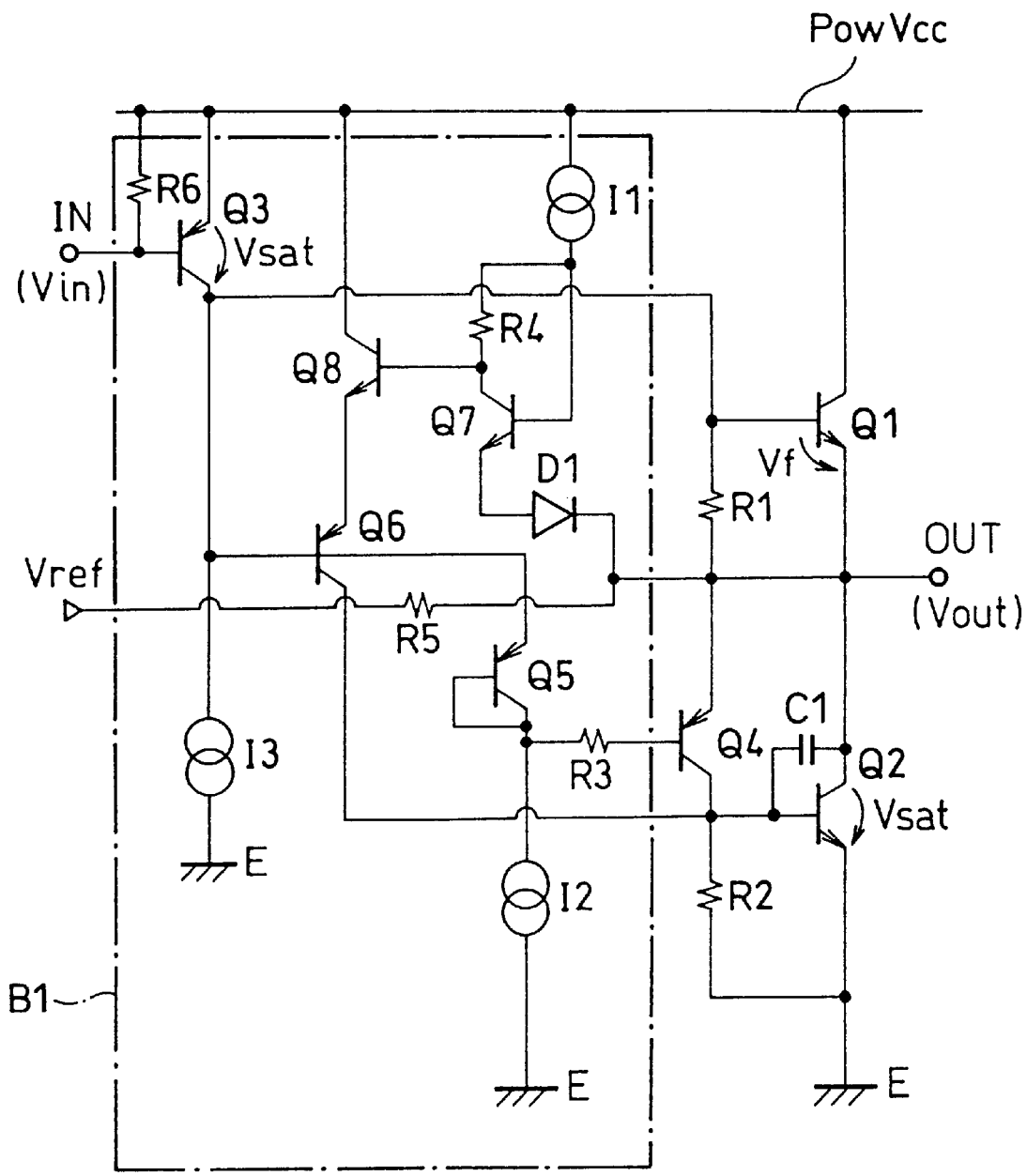
FIG. 1 is a schematic diagram representation of a conventional power drive circuit.
Figure 2:
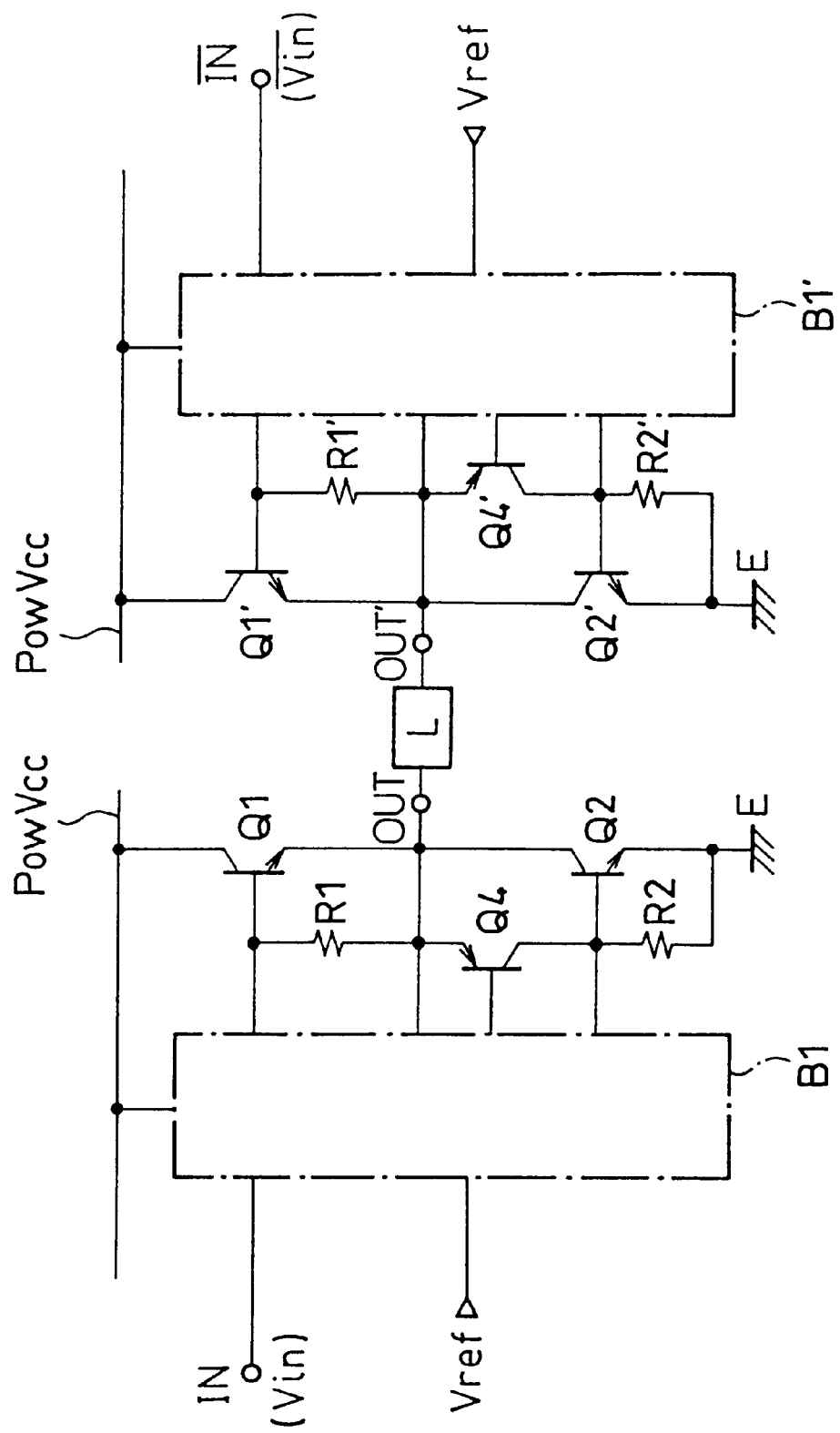
FIG. 2 is a schematic diagram representation of a conventional BTL power drive circuit.
Figure 3:
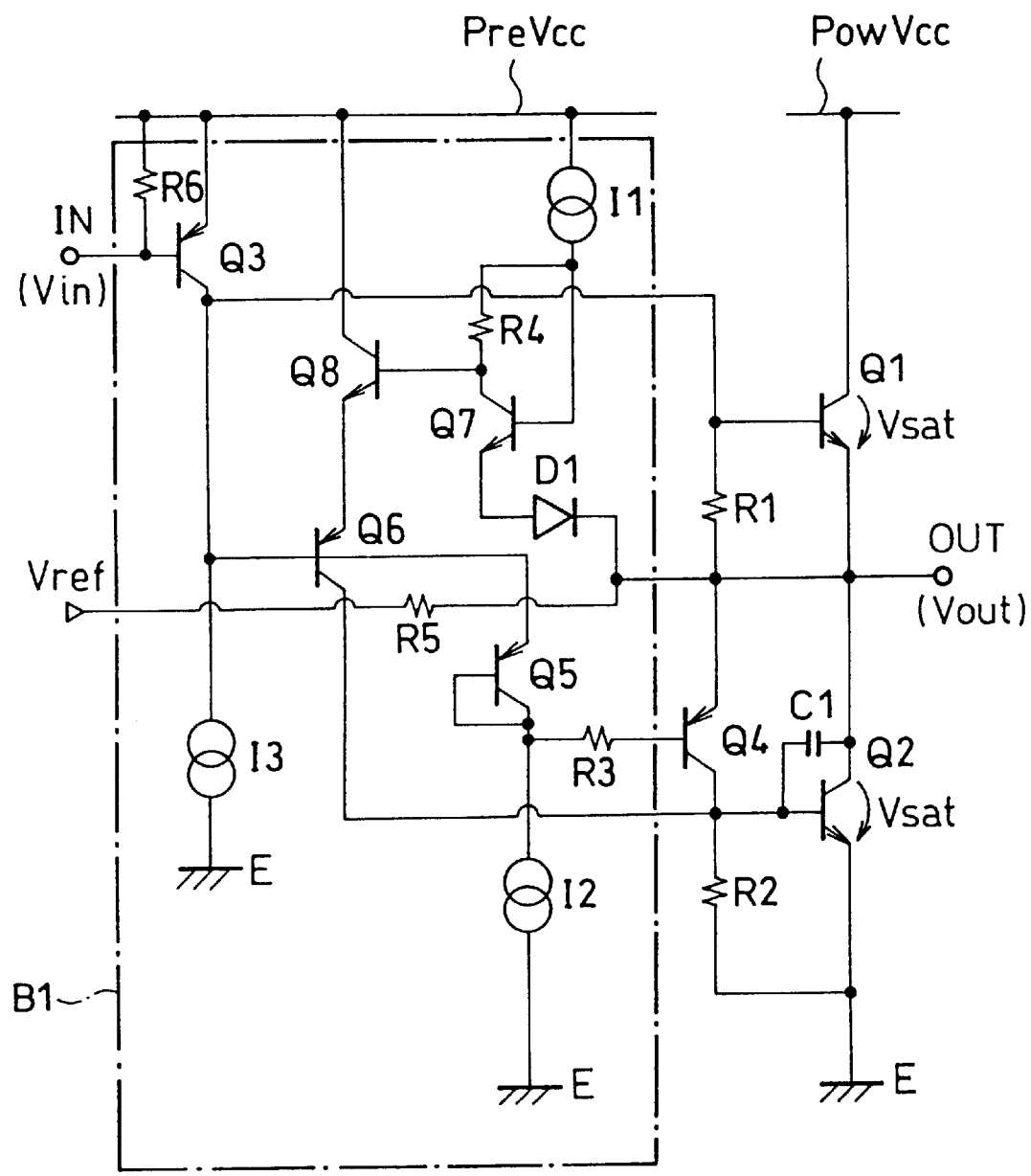
FIG. 3 is a schematic diagram representation of an improved power drive circuit.
Figure 4:
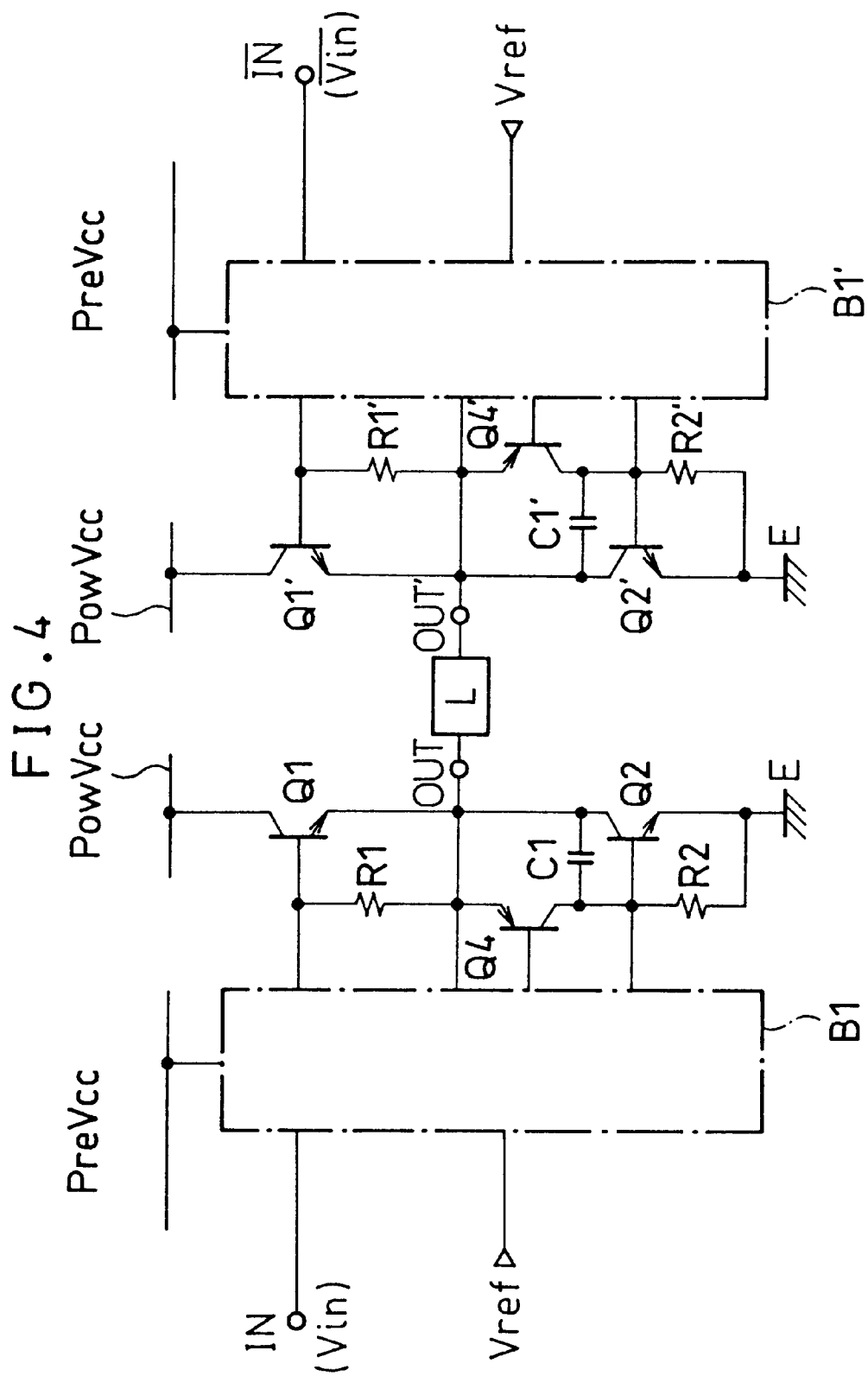
FIG. 4 is a schematic diagram representation of an improved BTL power drive circuit.
Figure 5:
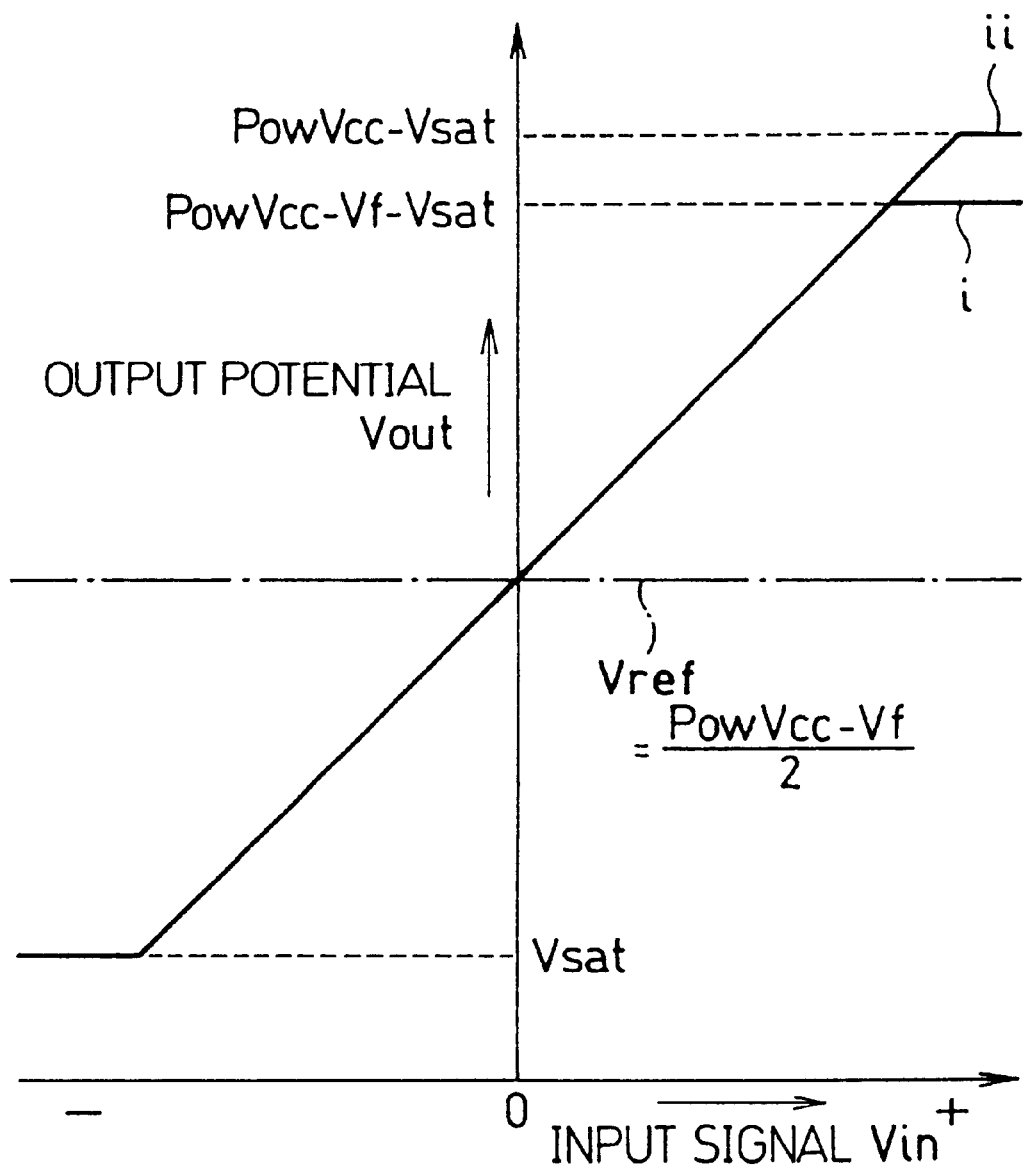
FIG. 5 is a graph illustrating input signal versus output potential characteristics of the conventional and the improved power drive circuits.
Figure 6:
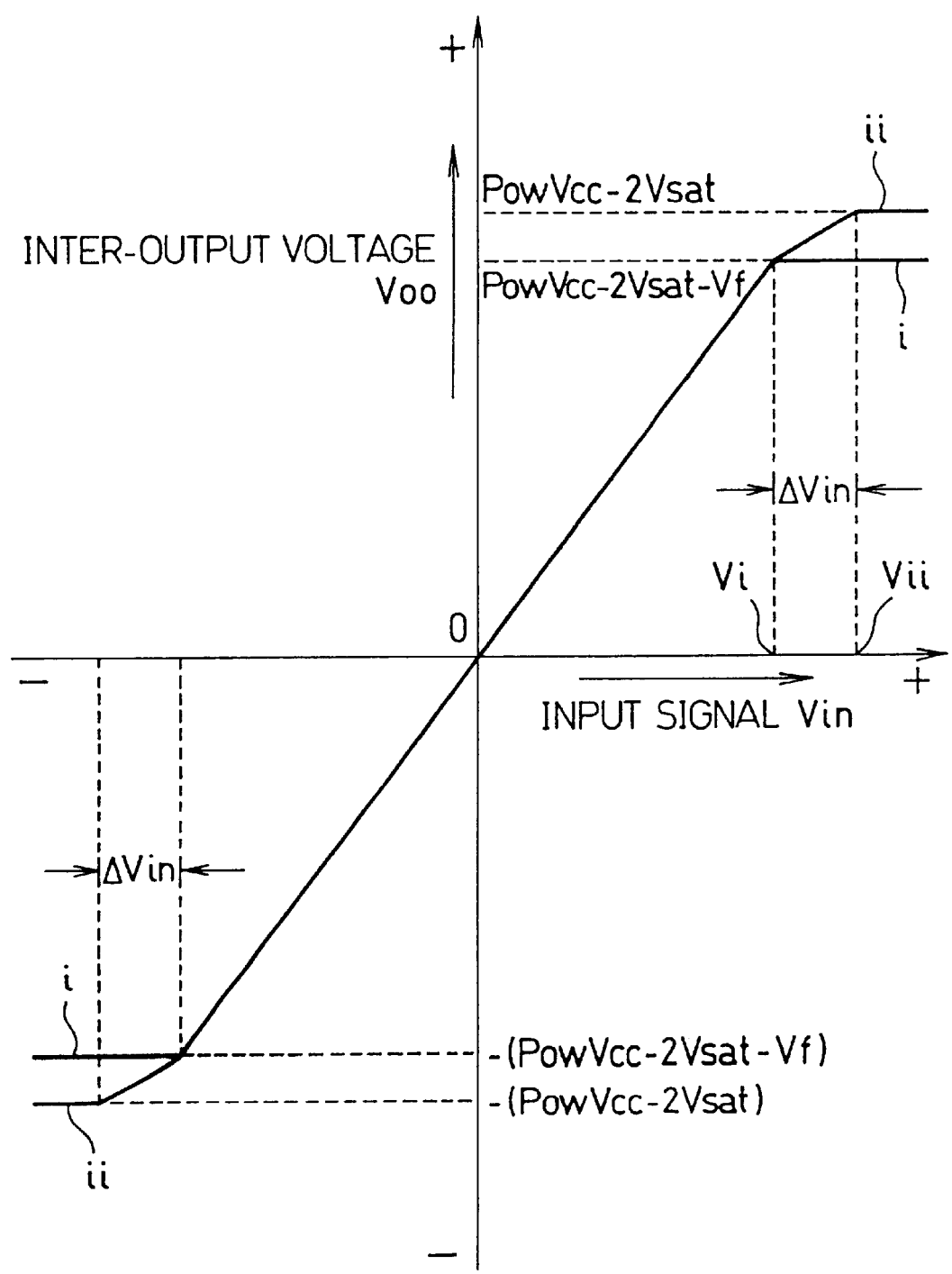
FIG. 6 is a graph illustrating input signal versus inter-output voltage characteristics of the conventional and the improved power drive circuits.

Referring further to FIGS. 3 and 4, the operation of a BTL power drive circuit of the invention will now be described.

In order to extend the dynamic range of the BTL power drive circuit, a determination is made at the final stage of manufacture of the BTL power drive circuit whether the potential PreVcc of the auxiliary power supply is to be set equal to the potential PowVcc (5 Volts for example) or to be set above PowVcc (12 Volts for example).

In a commonly used first mode in which the auxiliary power supply potential PreVcc is set equal to the potential PowVcc of the main power supply, power consumption is small, so that this mode is recommended when the width of the dynamic range is not a serious problem.

On the other hand, a second mode in which the potential PreVcc of the auxiliary power supply is set higher than the potential PowVcc of the main power supply is useful when a wider dynamic range is needed in driving a given load. In this mode, the dynamic range can be extended by use of such higher auxiliary potential, although power consumption increases.

The input signal Vin is supplied to the input terminal IN and is automatically superposed on the DC potential arising from the auxiliary power supply of the pre-stage differential amplifier shown in FIG. 3, in both mode where the auxiliary power supply potential PreVcc is set equal to and above the main power supply potential PowVcc. The internal reference voltage Vref then needs to be set to an appropriate level in accord with the potential PreVcc of the auxiliary power supply, as described below.

In the mode where the potential PreVcc of the auxiliary supply shown in FIGS. 3 and 4 is set equal to the potential PowVcc of the main power supply, the internal reference potential Vref is set to $$Vrefi=(PowVcc-Vf)/2$$

by turning off the switch SW11 of FIG. 7 and rendering the transistor Q11 non-conductive to utilize the potential drop Vf across the diode D11.

Figure 8:
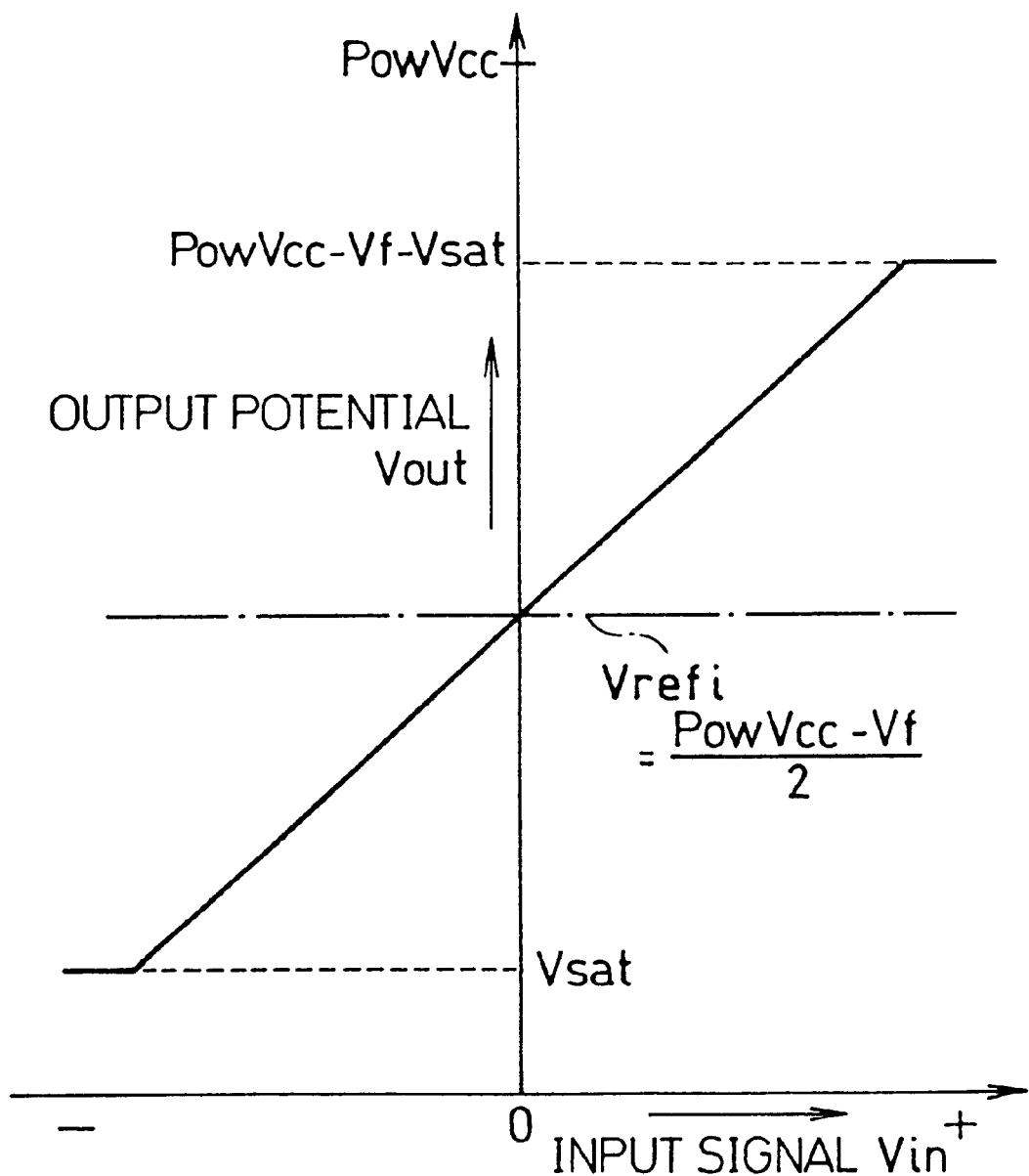
FIG. 8 shows a first mode of input signal versus output potential characteristic of a power drive circuit of the invention.

In this case, the output potential Vout has a dependence on the input signal Vin of the power drive circuit shown in FIG. 3, characterized by the saturation voltage Vsat and the internal reference potential Vrefi as shown in FIG. 8. As shown in FIG. 8, the upper limit of the output potential Vout is [PowVcc−Vf−Vsat], and the lower limit is Vsat. It is seen that the width of the dynamic range is [PowVcc−2Vsat−Vf] and that the internal reference potential Vref is set to Vrefi=[(PowVcc−Vf)/2] which is the medium of the dynamic range.

Figure 10:
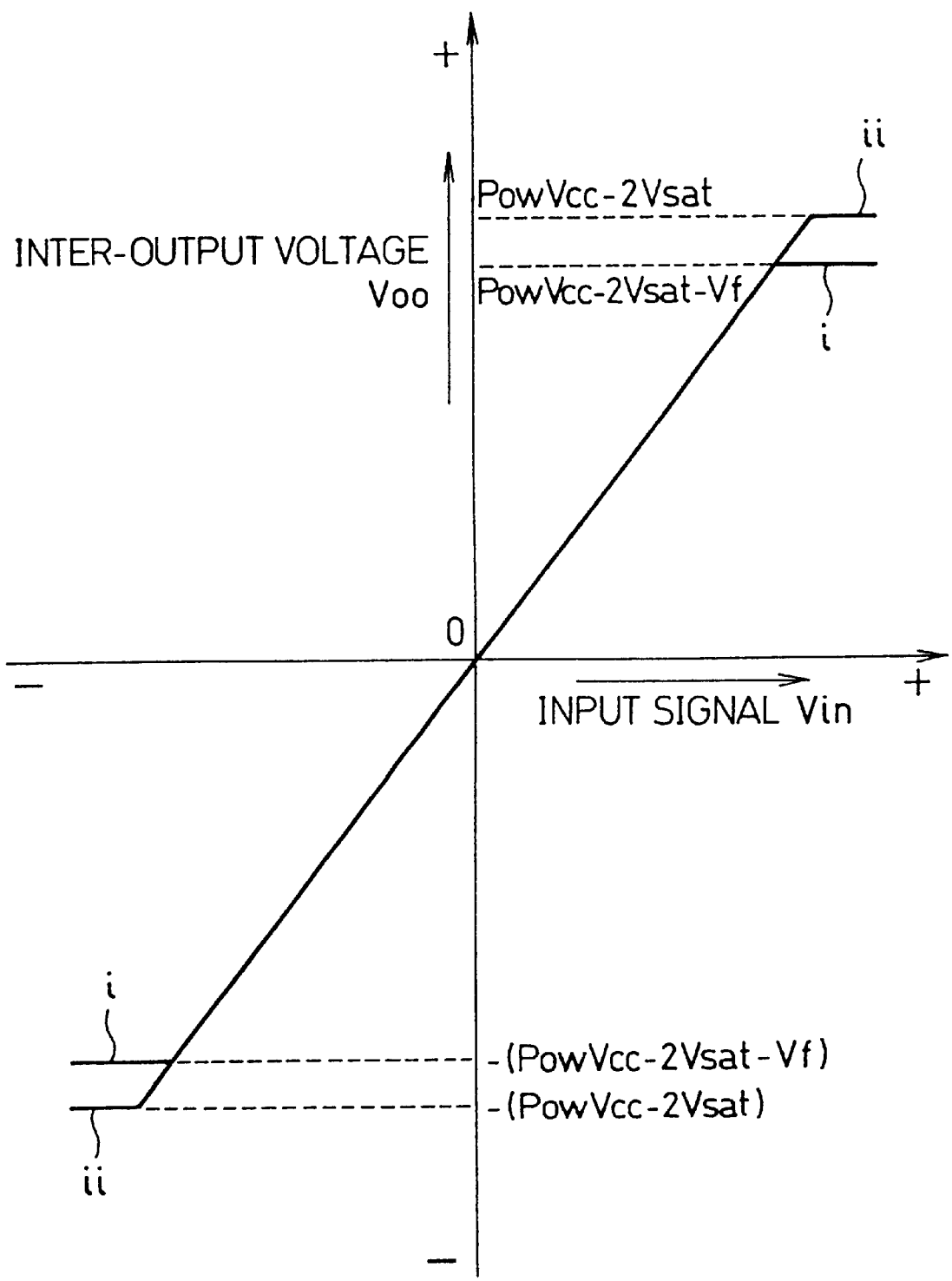
FIG. 10 shows an input signal versus inter-output voltage characteristic of a power drive circuit of the invention.

Thus, when the auxiliary power supply potential PreVcc is set equal to the main power supply potential PowVcc, the inter-output voltage Voo has a functional dependence on the input signal Vin of the BTL power drive circuit shown in FIG. 4 characterized by the internal reference potential Vrefi as shown by a characteristic input signal versus inter-output voltage curve "i" in FIG. 10.

It should be noted that the upper and the lower limits of the inter-output voltage Voo are [±(PowVcc−2Vsat−Vf)] as shown by curve "i" of FIG. 10, and that, although the dynamic range is a little smaller in width, the input-output characteristic remains linear over the dynamic range. It should be also noted that the circuit does not suffer problems of large power consumption.

In the second mode where the potential PreVcc of the auxiliary power supply as shown in FIGS. 3 and 4 is set higher than the potential PowVcc of the main power supply, the switch SW11 is turned on and the transistor Q11 is made conductive to utilize the saturation voltage Vsat of the transistor Q11 for an extended output range and to generate a required potential Vrefii (which is approximately equal to PowVcc/2) as the internal reference potential Vref.

Figure 9:
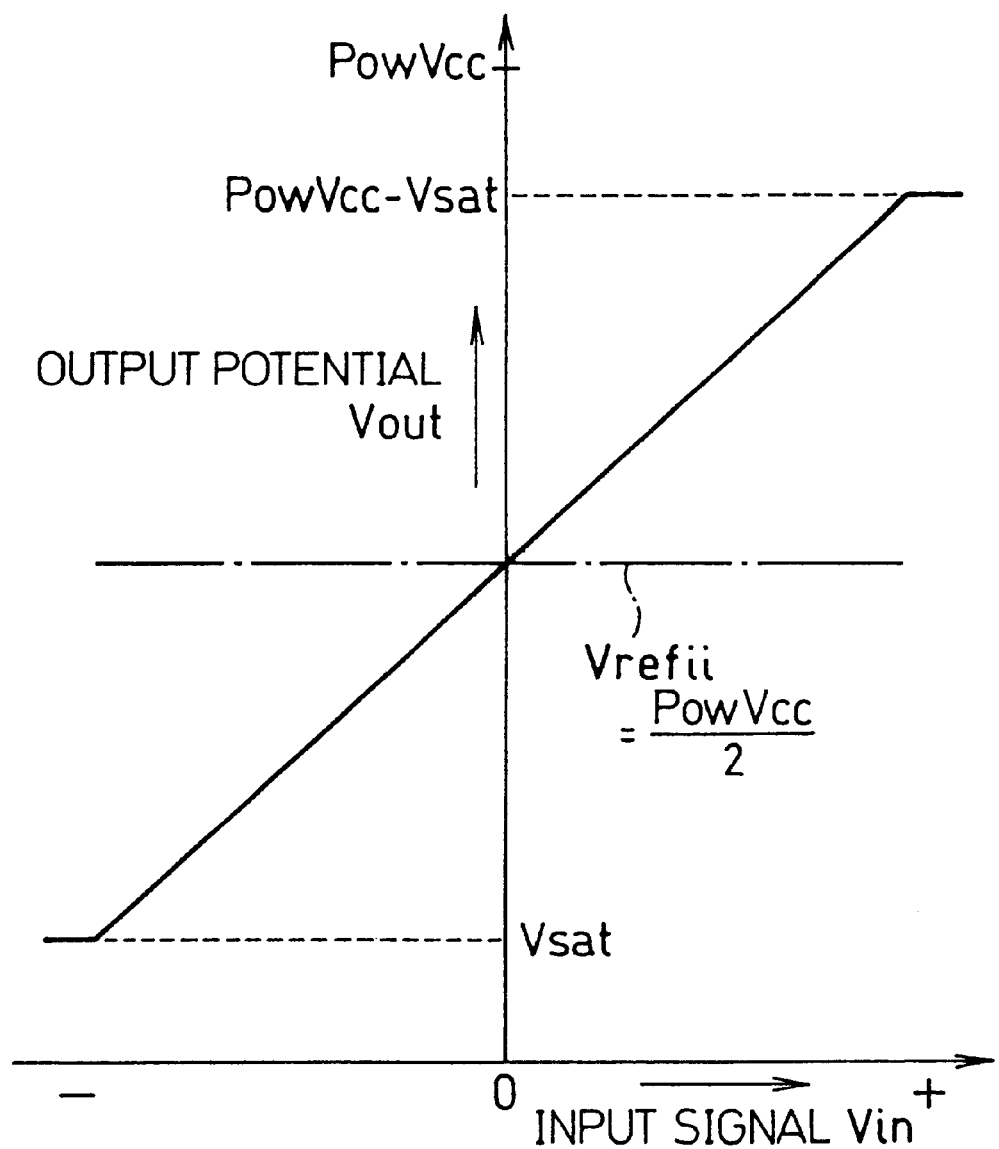
FIG. 9 shows a second mode of input signal versus output potential characteristic of a power drive circuit of the invention.

In this case, the output potential Vout varies with the input signal Vin as shown by an input signal versus output potential curve characterized by the saturation voltage Vsat and the internal reference potential Vrefii, as shown in FIG. 9. It is noted in FIG. 9 that the upper limit of the output potential Vout is [PowVcc−Vsat] and the lower limit is Vsat. Since the width of the dynamic range is [PowVcc−2Vsat], and the internal reference potential Vrefii is [PowVcc/2], the internal reference potential Vrefii is the medium of the dynamic range.

Thus, given an auxiliary power supply potential PreVcc set higher than the main power supply potential PowVcc, the inter-output voltage Voo of the BTL power drive circuit shown in FIG. 4 varies with the input signal Vin as shown by a curve "ii" characterized by the internal reference potential Vrefi, as shown in FIG. 10.

From the characteristic curve "ii" of FIG. 10, it is seen that the dynamic range has an extended upper and lower limits of [±(PowVcc−2Vsat)] in the positive and negative regions of input signals Vin, and that the input-output characteristic advantageously remains linear over the extended dynamic range, although power consumption will increase a little.

What I claim is:

1. A power drive circuit including:

a first push-pull type output transistor section connected between a main power supply having a potential and a ground;

a first input control section, connected between an auxiliary power supply having a potential and said ground, for receiving an input signal and an output reference potential to provide said first push-pull type output transistor section with a first control signal;

a second push-pull type output transistor section connected between said main power supply and said ground;

a second input control section connected between said auxiliary power supply and said ground, for receiving said output reference potential and an inverted input signal, which is an inversion of said input signal, to provide said second push-pull type output transistor section with a second control signal, wherein each of said first and said second output transistor sections provides one of two different dynamic ranges, a first dynamic range for a first mode where said potential of said auxiliary power supply is equal to said potential of said main power supply and a second dynamic range for a second mode where said potential of said auxiliary power supply is higher than said potential of said main power supply; and said power drive circuit wherein said output reference potential matches the medium of the dynamic ranges of said first and second output transistor sections.

2. The power drive circuit according to claim 1, further comprising a reference potential set-up circuit connected between said main power supply and said ground and connected to said first input control section and said second input control section, wherein the reference potential set-up circuit is capable of selectively setting up two different potentials for use as the medium of the dynamic range of said first and second output transistor sections.

3. The power drive circuit according to claim 2, characterized in that said reference potential set-up circuit comprises a circuitry including a transistor and a diode connected in parallel with said transistor, and is adapted to generate two different output reference potentials across said diode by turning on or off said transistor.

4. The power drive circuit according to claim 2, wherein said reference potential set-up circuit comprises:

a parallel circuitry including a transistor and a diode in parallel with said transistor;

voltage dividing resistors having a node located between the voltage dividing resistors, the voltage dividing resistors connected in series with the parallel circuitry between said main power supply and said ground; and control means for controlling the conduction of said transistor connected between said main power supply and said ground, and wherein said output reference potential is given by the potential obtained at said node between said voltage dividing resistors.

* * * * *